United States Patent [19]
Jambotkar et al.

[11] Patent Number: 4,689,869
[45] Date of Patent: Sep. 1, 1987

[54] FABRICATION OF INSULATED GATE GALLIUM ARSENIDE FET WITH SELF-ALIGNED SOURCE/DRAIN AND SUBMICRON CHANNEL LENGTH

[75] Inventors: Chakrapani G. Jambotkar, Hopewell Junction; Robert B. Renbeck, Staatsburg, both of N.Y.

[73] Assignee: International Business Machines Corporation, Armonk, N.Y.

[21] Appl. No.: 848,874

[22] Filed: Apr. 7, 1986

[51] Int. Cl.$^4$ ............................................. H01L 21/00
[52] U.S. Cl. .................................... 437/44; 156/643; 357/23.2; 357/23.3; 357/22
[58] Field of Search ...................... 29/571; 156/643; 357/23.2, 23.3, 22 MD, 22 A

[56] References Cited

U.S. PATENT DOCUMENTS

| | | | |
|---|---|---|---|
| 4,093,503 | 6/1978 | Harris et al. | 156/643 |
| 4,354,896 | 10/1982 | Hunter et al. | 156/643 |
| 4,358,340 | 11/1982 | Fu | 156/643 |
| 4,419,809 | 12/1983 | Riseman et al. | 29/571 |
| 4,430,791 | 2/1984 | Dockerty | 29/571 |
| 4,432,132 | 2/1984 | Kinsbron et al. | 156/643 |
| 4,445,267 | 5/1984 | De La Moneda et al. | 29/571 |
| 4,587,709 | 5/1986 | Fowler et al. | 357/23.3 |
| 4,645,563 | 2/1987 | Terada | 156/643 |
| 4,648,937 | 3/1987 | Ogura et al. | 156/643 |

OTHER PUBLICATIONS

"Submicron-Gate Self-Aligned Gallium Arsenide FET Fabrication," (anon.), IBM Technical Disclosure Bulletin, vol. 22, No. 6, Nov. 1985, pp. 2687-2690.
Johnson et al., "Method of Making Submicron Dimensions in Structures Using Sidewall Image Transfer Techniques," IBM Technical Disclosure Bulletin, vol. 26, No. 9, Feb. 1984, pp. 4587-4589.
Jackson et al., "A Novel Submicron Fabrication Technique," IEDM, 1979, Conference Volume, pp. 58-61.
Hunter et al., "A New Edge-Defined Approach for Submicrometer MOSFET Fabrication," IEEE Electron Device Letters, vol. EDL-2, No. 1, Jan. 1981, pp. 4-6.
Ipri et al., "Submicrometer Polysilicon Gate CMOS/SOS Technology," IEEE Transactions on Electron Devices, vol. ED-27, No. 7, Jul. 1980, pp. 1275-1279.
Japanese Journal of Applied Physics, vol. 19, No. 5, May 1980, pp. 1225-1227, "A New Field-Effect Transistor with Selectively Doped GaAs/n-Al$_x$Ga$_{1-x}$As Heterojunctions", by T. Mimura et al.
IEEE Electron Device Letters, vol. EDL-5, No. 9, Sep. 1984, pp. 379-381, "A GaAs Gate Heterojunction FET", by P. M. Solomon et al.
Electronics Letters, vol. 20, pp. 462-463, (1984), "n+--GaAs/Undoped GaAlAs/Undoped GaAs Field-Effect Transistor", by K. Matsumoto et al.
Electronics Letters, vol. 21, No. 13, Jun. 20, 1985, pp. 580-581, "p-Channel GaAs SIS, (Semiconductor-Insulator-Semiconductor) FET", by K. Matsumoto et al.

Primary Examiner—Brian E. Hearn
Assistant Examiner—M. Wilczewski
Attorney, Agent, or Firm—T. Rao Coca

[57] ABSTRACT

Disclosed is a process for forming a high-speed, self-aligned GaAs-gate field effect transistor with submicron channel length. Starting with a semi-insulating GaAs substrate having a thin gate insulator layer of undoped AlGaAs and a comparatively thick highly doped GaAs layer, a metal contacting the doped GaAs layer is controllably formed by sidewall image transfer and planarization etchback technique. The thickness and width of the metal strip are in the low submicron range. Using the metal strip as a mask, the doped GaAs is patterned into a GaAs gate for the FET having the characteristics of submicron width (i.e., the dimension of the gate measured along the source-drain), substantially vertical walls and contacted on the top thereof in a self-aligned relationship by the metal strip. Next, a submicron wide insulator sidewall is formed on the vertical walls of the gate. By ion implanation across the AlGaAs layer using the gate structure and a patterned photoresist as a mask, source and drain are formed in the substrate in self-aligned relation with the gate. Contact metallization is formed to electrically contact the source, drain and the gate.

30 Claims, 12 Drawing Figures

FABRICATION OF INSULATED GATE GALLIUM ARSENIDE FET WITH SELF-ALIGNED SOURCE/DRAIN AND SUBMICRON CHANNEL LENGTH

BACKGROUND OF THE INVENTION

The invention relates to gallium arsenide (GaAs) integrated circuit fabrication technology, and more particularly, to a method of forming on a GaAs substrate an insulated GaAs-gate field effect transistor (FET) having self-aligned source/drain and submicron channel length.

Since the mobility of electrons is substantially higher in GaAs than in silicon, higher integrated circuit performance can be achieved using GaAs as the substrate material compared to silicon for an equivalent power consumption. A number of transistor types have been built using GaAs material. The most common and commercially successful type is the metal-semiconductor field effect transistor (MESFET). This device comes in two forms: the depletion mode MESFET (D-MESFET) and the enchancement mode MESFET (E-MESFET). The basic MESFET consists of a metal Schottky gate placed between a source and a drain region. The transistor typically is formed in two ion-implantation steps: a relatively low concentration implant below the gate region provides the channel, and a relatively high concentration implant in close vicinity to the gate provides the source and the drain regions. In a D-MESFET, with no voltage applied to the gate, current flows through the channel between the transistor's source and drain when a voltage is applied across the source and drain. The application of a gate voltage (negative with respect to the source) causes the channel to become narrower, reducing current flow. If a sufficiently negative gate voltage is applied, the current flow is pinched off. In an E-MESFET, the region under the gate is doped such that the channel is pinched off when no gate voltage is applied. A small positive gate voltage with respect to the source will initiate current flow.

Another GaAs device that has shown potential for commercialization is the high electron mobility transistor (HEMT). This structure has also been termed as the selectively doped heterojunction transistor (SDHT), modulation doped FET (MODFET) and two-dimensional electron gas FET (TEGFET). These are superlattice heterojunctions in which layers of gallium-aluminium-arsenide (AlGaAs) are typically deposited on an undoped GaAs channel. One such device was disclosed in an article by T. Mimura et al, entitled "A New Field Effect Transistor with Selectively Doped GaAs/n-GaAl$_x$As$_{1-x}$ Heterojunctions", Japanese Journal of Applied Physics, Vol. 19. No. 5, pages L225-227 (May 1980). The device described in this article consists of a pair of undoped GaAs layers sandwiching a layer of silicon doped GaAlAs. A Schottky gate is provided by the deposition of aluminum on the surface of the top undoped GaAs layer. Electron mobility in a HEMT is higher than a MESFET as the charge carriers are not scattered by dopant ions in the channel. By raising gate voltage just above the threshold, a HEMT quickly reaches its full transconductance, giving it a very fast turn-on time. However, the threshold voltage of a HEMT is neither as controllable nor as low as is desirable for logic circuits with reduced power supply voltages. The threshold variability is due to its sensitivity to the doping and thickness of the active layer. Also, the particular layered structure of the HEMT in combination with the Schottky contact to the top results in a threshold voltage which departs significantly from the desired near-zero value.

To overcome the deficiencies of the HEMT, a new semiconductor-insulator-semiconductor transistor has been proposed in U.S. patent application Ser. No. 454,741, entitled "A Double Heterojunction FET with Ohmic Semiconductor Gate and Controllable Low Threshold Voltage" by J. Rosenerg which is assigned to IBM Corporation, the present assignee. This structure consists of a heavily doped n-type GaAs gate with undoped AlGaAs as the gate insulator, on an undoped GaAs layer. Threshold voltage of this device structure is naturally near zero since the work function difference between the doped GaAs gate and the undoped GaAs is essentially zero. This structure is well suited for low-voltage logic applications. Another advantage of this structure is that, at least to first order, its threshold voltage is independent of the thickness and aluminum mole fraction of the AlGaAs layer. This undoped heterojunction structure is inherently more resistant to high-temperature annealing, not suffering from a field-enhanced degradation of the heterojunction due to ionized impurities.

Despite these advantageous features of the GaAs-gate heterojunction FET, the prior art methods of fabrication provided a structure having a rather large gate length. For example, the article by P. M. Solomon et al, entitled "A GaAs Gate Heterojunction FET", IEEE Electron Device Letters, Vol. EDL-5, No. 9, pages 379-381, September 1984 discloses an N type GaAs-gate FET having a gate length of 1.5 $\mu$m. The article by K. Matsumoto et al, entitled "n+ GaAs/Undoped GaAlAs/Undoped GaAs Field-Effect Transistor" Electronics Letters, 1984, 20, pages 462-463 discloses a method of forming a GaAs gate of length 2 $\mu$m. Likewise, the article by K. Matsumoto et al, entitled "p-Channel GaAs SIS (Semiconductor-Insulator-Semiconductor) FET", Electronics Letters, 1985, 21, pages 580-581 discloses a P channel GaAs gate FET having a gate length of 2 $\mu$m. The basic reason for such large dimensioned gate structures is that these prior art methods utilize standard photolithography and etching techniques to form the gate. These methods are thus not suitable for fabrication of submicron-length gate structures that are demanded by high-density and-speed GaAs memory and logic circuits. Another shortcoming of some of these prior art structures is that the metal contact to the GaAs gate tends to be sufficiently away so as to appreciably increase gate resistance. Yet another disadvantage is that these prior art methods obtain a structure wherein the source/drain is either too far away from the gate, leading to increased source/drain resistance, or too close to the gate leading to increased gate-source/drain overlap capacitance. From a performance standpoint, it is imperative that the source/drain be located at an optimal distance from the gate which permits minimization of both source/drain resistance and gate-source/drain overlap capacitance. As device dimensions shrink to submicron dimensions, this optimization becomes even more important.

It would appear that a submicron-length GaAs gate FET may be realized by utilizing submicron E-beam lithography to define the gate. However, existing E-beam systems require an E-beam pattern generator, sophisticated E-beam optics and custom software to control, all of which render this technique prohibitively expensive.

Accordingly, it is an object of the present invention to provide a method of forming a GaAs-gate heterojunction FET which has submicron-length gate and self-aligned metal contacting the gate.

Another object of the invention is to provide a method of forming a high-speed GaAs-gate FET by minimizing the source/drain resistance and gate-source/drain capacitance.

SUMMARY OF THE INVENTION

The invention is a process of forming a high speed, submicron gate-length, self-aligned GaAs-gate FET device. Starting with an undoped GaAs substrate having successively formed layers of undoped GaAlAs and highly doped (e.g., N type) GaAs, a submicron-wide metal contacting the doped GaAs layer is formed utilizing sidewall image transfer technique. This technique includes forming on the doped GaAs a mandrel of a suitable material (e.g., photoresist) having substantially vertical and horizontal surfaces; depositing on the mandrel a conformal, submicron thick (0.4-0.5 μm) highly conductive layer of a suitable metal; establishing through RIE submicron-wide metal sidewalls along the vertical sides of the mandrel; removing the unwanted portion of the metal by a photomasking operation; coating a thick layer of a planarizing material (e.g., photoresist); etching back by RIE the upper portions of the resulting structure until the metal sidewall is transformed into a metal strip having substantially vertical walls and a substantially horizontal surface; and removing the remnant planarizing material and the mandrel material.

Using the submicron-wide metal as a mask, the doped GaAs is patterned into a gate for the FET having the characteristics of submicron length, substantially vertical surfaces and fully contacted metal on the top. Next, a conformal layer of an insulator (e.g., $SiO_x$) of submicron thickness (0.1-0.3 μm) is formed at a low temperature. This is followed by RIE to remove the insulator from the horizontal surfaces, leaving submicron-wide insulator spacers abutting the gate structure. By means of ion implanatation across the exposed AlGaAs layer, source and drain are formed in the undoped GaAs substrate in a self-aligned fashion with respect to the gate structure. The AlGaAs layer beneath the doped GaAs gate serves as the gate insulator. Damage caused to the GaAs substrate as a result of the ion implantation step is removed by annealing. The ion implantation species, dose, energy, and annealing process are chosen such as to achieve a source/drain junction depth large enough to minimize the source/drain series resistance, but small enough to minimize the parasitic capacitance of the gate to the source/drain. Finally, conductive electrical contacts are established with the source/drain and gate by forming a passivation layer, making contact openings therein, and depositing and delineating a suitable metal.

BRIEF DESCRIPTION OF THE DRAWINGS

The novel features, process steps and their combination which are characteristic of the invention are set forth in the appended claims. The invention, however, will be best understood by reference to the detailed description which follows in conjunction with the accompanying drawings wherein:

DETAILED DESCRIPTION OF THE PREFERRED EMBODIMENT

Figure 12:
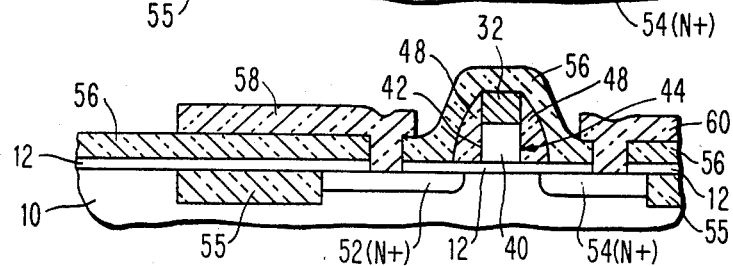

Referring now to FIG. 12, there is shown in this figure a fast-switching insulated GaAs-gate N-channel FET formed on an undoped GaAs substrate 10. The GaAs gate 40 is highly N doped and is of submicron length (e.g., 0.4-0.5 μm). Metal 32 precisely overlying the gate 40 provides a low resistance ohmic contact to the gate electrode 40. An undoped AlGaAs 12 forms the gate insulator. N type source 52 and drain 54 are formed in the substrate 10 at a precise predetermined submicron spacing (e.g., 0.1-0.3 μm) from and selfaligned with the vertical edges 42 and 44 of gate 40, respectively. The submicron spacing is achieved by means of sidewall insulator 48 abutting the gate 40. 58 and 60 represent conductive metallization establishing ohmic contacts with source 52 and drain 54, respectively. The FIG. 12 structure also shows optional device isolation regions 55 if the semiinsulating GaAs substrate 10 is not able to provide the required device isolation.

Figure 1:
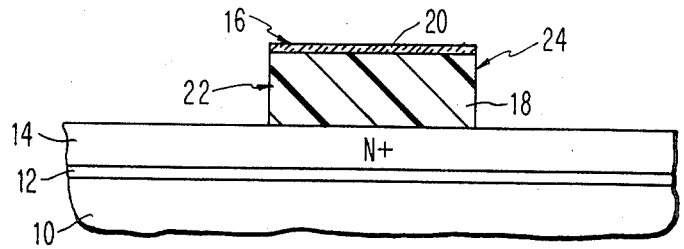
FIG. 1-12 are flow diagrams illustrating by sequential cross-sectional representation the process steps of the present invention culminating in the self-aligned, submicron GaAs gate FET structure shown in FIG. 12.

FIGS. 1-12 illustrate sequential steps in the fabrication of the self-aligned GaAs-gate FET device with submicron channel length in accordance with the process of the present invention. Referring to FIG. 1, starting with a semi-insulating GaAs wafer (not shown), a thick (typically, about 1 μm thickness) buffer or substrate layer 10 of undoped GaAs is formed thereon. Next a relatively thin undoped AlGaAs layer 12 is formed over the GaAs substrate 10. The AlGaAs layer 12 serves as the gate insulator for the FET device. Since neither the thickness nor the mole fraction of aluminum in AlGaAs gate insulator determine the threshhold voltage, their precise values are, to a first order, inconsequential. Typically, the thickness of insulator layer 12 is in the range of about 200-300 Å. A typical aluminum mole fraction is that given by $Al_{0.4}Ga_{0.6}As$. Following the growth of the AlGaAs layer 12, a highly N doped GaAs layer 14 of thickness 0.2-0.3 μm is formed thereon. Typical N type dopant used for doping the layer 14 is silicon. The dopant concentration in the GaAs layer 14 is governed by the required near-zero threshold voltage of the device. For a Vth of about 0.1 V, the preferred red dopant concentration is about $1 \times 10^{18}$ atoms/cc. The layers 10, 12 and 14 may be formed by a conventional process such as molecular beam epitaxy (MBE) or metal organic chemical vapor deposition (MOCVD).

Continuing with the structure of FIG. 1, a blanket layer 18 of photoresist, typically about 1 μm thickness, is formed next by conventional spin coating or spraying, followed by baking. Thereafter, about 0.1-0.15 μm thickness layer 20 of a dielectric material such as $Si_xN_y$ (x and y are arbitrary numbers, for example x=3 and y=4) is formed over the photoresist layer 18. Preferably, the $Si_xN_y$ layer is formed by plasma enhanced CVD using a gas mixture of silane and ammonia. Then, by standard lithography and etching, the $Si_xN_y$ and photoresist layers are patterned into a substantially vertical-walled island or mandrel 16 composed of photoresist layer 18 and $Si_xN_y$ layer 20. To obtain the substantially vertical mandrel walls 22 and 24, the $Si_xN_y$ and photoresist layers are etched by RIE. Typically, $CF_4$ is used for etching $Si_xN_y$ and $O_2$ for etching the photoresist. The basic purpose of the $Si_xN_y$ layer 20, as will become more apparent later on, is to serve as an etchstop during a subsequent etching step.

Figure 2:
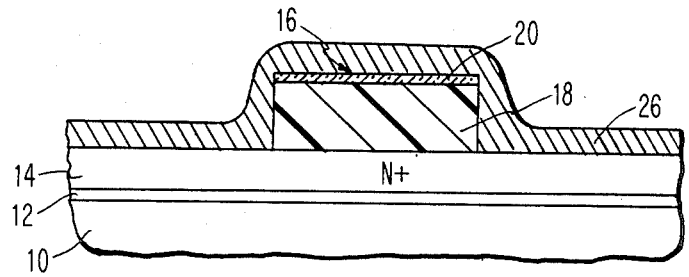

The next step is to form a controlled, submicron thick metal layer on the sidewalls 22 and 24 of the mandrel 16. This is preferably accomplished by forming a conformal layer 26 of a metal by sputtering, E-beam evaporation or ion-beam deposition, as illustrated in FIG. 2. Regardless of which method of forming the layer 26 is selected, it is accomplished at a low temperature less than about 300° C. This metal should be compatible with the N+ GaAs gate material in terms of adhesion, etc. In general, a refractory metal will be suitable in view of the relatively high temperature annealing heat cycle which follows later. Molybdenum and molybdenum-germanium are suitable metals. Since the thickness of the metal layer 26 will eventually determine the FET channel length, to obtain submicron channel length, the thickness of layer 26 should be correspondingly chosen to be submicron. Typical thickness of layer 26 is in the range of about 0.3-0.5 μm.

Figure 3:
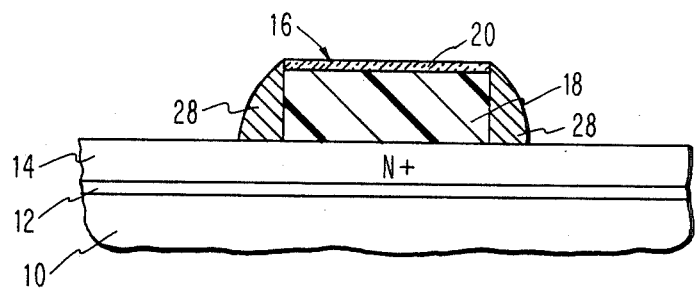
Figure 4:
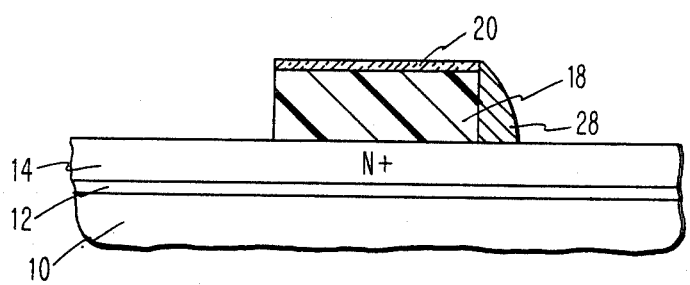

Next, referring to FIG. 3, the layer 26 is subjected to anisotropic etching to substantially remove the layer from all substantially horizontal surfaces and leave the sidewall layer 28 on the substantially vertical surfaces 22 and 24 of the photoresist mandrel 16. RIE in $CF_4$ plasma may be used if the metal 26 is molybdenum. Thereafter, by using standard photolithographic masking and etching steps, unwanted portion of the metal sidewall 28 is removed, leaving the metal sidewall only in the area corresponding to the desired GaAs gate width. The resulting structure is depicted in FIG. 4.

Figure 5:
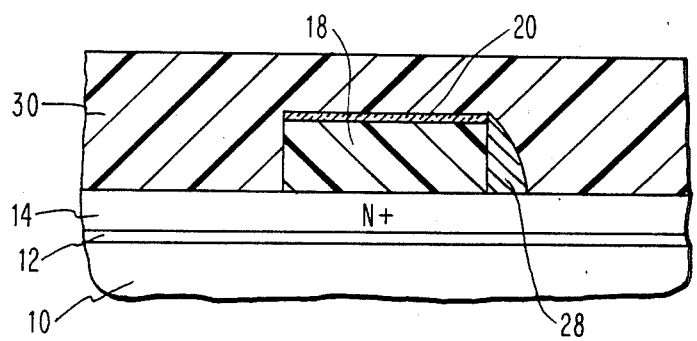
Figure 6:
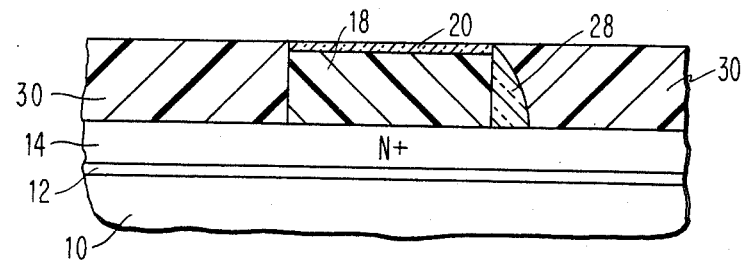
Figure 7:
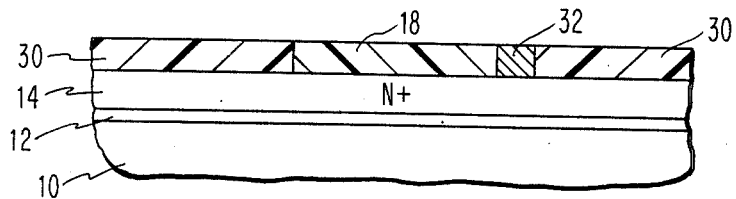

Progressing toward the structure of FIG. 5, next a relatively thick (typical thickness 1.5-2.0 μm) layer 30 of a viscous organic material is applied to planarize the structure. Suitable materials for this planarization purpose include polyimide and photoresist. If photoresist or polyimide is used for planarization, it is applied by spin coating followed by hardening. The planarized structure is then subjected to RIE, typically, in $O_2$ plasma in order to etch off the layer 30 down to the surface of the $Si_xN_y$ dielectric layer 20 as illustrated in FIG. 6. In this connection, the $Si_xN_y$ layer 20 serves as an etch stop as previously noted. The etching is then continued as illustrated in FIG. 7 by switching to $CF_4$ etchant gas to controllably remove the $Si_xN_y$ layer 20 and further etch back the upper surface portions of the metal sidewall, until the metal is reduced to a sufficiently thin strip 32 with substantially vertical edges. The thickness of the remnant metal 32 is sufficiently large so as to eventually provide a low resistance path above the GaAs gate. Typical thickness of the metal strip 32 is in the range of about 0.2-0.35 μm. The $CF_4$ etch back is accomplished by time-controlled RIE. During this metal etch back process step, the upper surface portions of the layers 18 and 30 are also removed at practically the same etch rate. Thereafter, the remaining portions of photoresist 18 and 30 are removed by conventional ashing, leaving a free-standing and well-delineated metal strip 32 having essentially vertical walls 34 and 36 and horizontal top surface 38.

Figure 8:
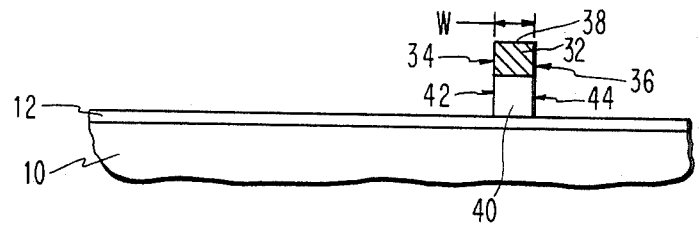

Next, using the metal strip 32 as a mask, the underlying N+ GaAs layer 14 is defined into a GaAs gate 40 of submicron width W as dipicted in FIG. 8. This gate definition is accomplished by RIE using, for example, a gas mixture of $CCl_2F_2$ and helium. Since the metal mask is provided with substantially vertical walls 34 and 36, the GaAs gate 40 defined by transferring the wall profile of the metal 32 to the layer 14 will also have substantially vertical walls 42 and 44 as illustrated in FIG. 8. In this manner, a structure composed of a submicron wide GaAs gate having atop thereof a metal strip of identically equal width is formed in a precisely controlled manner above the AlGaAs layer 12.

Figure 9:
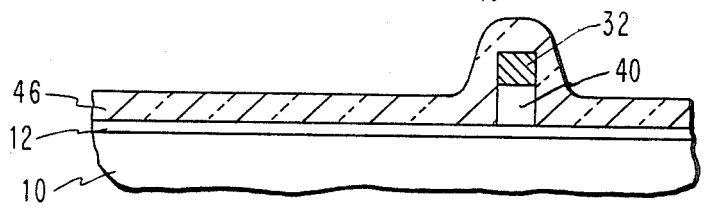
Figure 10:
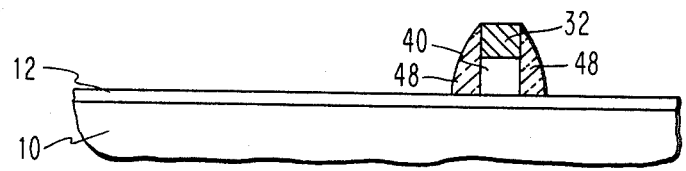

Next, as illustrated in FIGS. 9-10, an insulator spacer abutting the composite gate structure 32-40 is formed. To achieve this end result, a conformal insulator layer 46 such as silicon dioxide or $SiO_x$ is formed covering the gate structure 32-40 and the exposed insulator layer 12. The layer 46 is typically formed by CVD at a low temperature of 300°-400° C. The thickness of the oxide 46 is dictated by the desired lateral spacing of the source-/drain regions with respect to the gate. Typically, the thickness of the layer 46 in the range 0.1-0.3 μm. By subjecting the layer 46 to RIE, it is removed from the horizontal surfaces, leaving the sidewall layer 48 on the substantially vertical surfaces of the composite gate structure 32-40 as shown in FIG. 10. If $SiO_x$ is used as the insulator 46, then $CF_4$ would be a suitable RIE gas.

Figure 11:
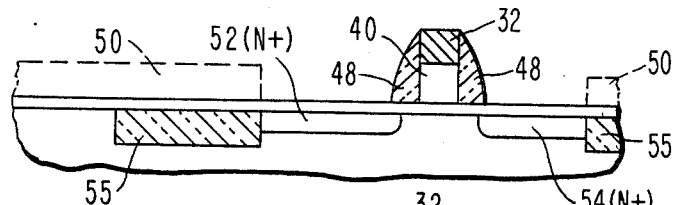

Next, referring to FIG. 11, a photoresist mask 50 is formed on the AlGaAs layer 12 to cover all regions of this layer except the gate regions and those in correspondence with the regions where the transistor source and drain regions are to be formed. Then, by N type ion implantation across the exposed AlGaAs layer 12, N+ source 52 and drain 54 are formed in the undoped GaAs substrate 10 in a self-aligned relationship with the gate structure 32-40. The particular combination of the implantation species, dose and energy is governed by the desired junction depth of the source/drain regions. This combination is selected such that the source/drain junction depth is large enough to provide minumum source/drain series resistance, but small enough to minimize the capacitance arising from the gate to the source/-drain. Typical dopant for ion implantation of source 52 and drain 54 is silicon (Si) at a dose of about $(2-4) \times 10^{13}$ ions/sq. cm. and energy of 80-100 Kev to attain a junction depth of 0.2-0.25 μm. The resist mask 50, the gate structure 32-40 and the associated sidewall insulator spacers 48 provide the selectivity in forming the N source 52 and drain 54 exactly as desired. In particular, the source 52 and drain 54 are situated precisely 0.1-0.3 μm away from the edges of the GaAs gate 40, a distance corresponding to the thickness of the insulator sidewall 48.

Continuing with the process steps pertaining to FIG. 11, the photoresist 50 is stripped off and the structure is subjected to an annealing process to remove the damage to the GaAs substrate 10 caused during the source-/drain ion implantation. One annealing process is capless arsine annealing at a temperature in the range 750° C. to 825° C. for about 10 minutes. Another annealing method is flash anneal using an infrared or halogen lamp at a temperature of about 750°-800° C. for a duration of about 2-30 seconds.

To prevent electrical leakage, isolation 54 between devices is then established, if desired, by utilizing a suitable mask and implanting boron ions at a high dose and energy. The isolation regions 54 typically extend to a depth of about 0.5 μm.

Turning to FIG. 12, next a passivation layer 56 of, for example, silicon dioxide is formed followed by making contact openings therein in correspondence with the source 52, drain 54 and gate 32-40 (gate contact opening is not shown in FIG. 12 due to its cross-sectional representation). The AlGaAs layer 12 exposed by the source/drain contact openings is then removed. Using a lift-off stencil, a contact metal such as gold-germanium-nickel of about 0.1-0.3 μm thickness is formed at all contact openings. The source and drain contact metal patterns formed in this manner are designated by 58 and 60, respectively. The contact metallurgy is preferably formed by evaporation. For forming good ohmic contacts, the contact metallurgy is annealed at a temperature of about 400°-450° C. for 50-120 seconds. Alternatively, laser annealing may be utilized for reducing the contact resistance.

As is apparent from the foregoing description, the GaAs-gate heterojunction FET fabricated in accordance with the process steps illustrated in FIGS. 1-12 has its source 52 and drain 54 in close proximity and at the two flanks of the composite gate 32-40. This self-aligned FET structure is characterized by a short submicron channel length that has both substantially reduced channel resistance and accompanying parasitic gate-to-channel capacitance. The device structure also has a minimum geometry because the composite gate 32-40 is of submicron width and the source 52 and drain 54 are defined by minimum lithography feature size. Thus, the self-aligned GaAs-gate FETs made in accordance with this novel and unobvious method do not have the undesirable performance limitations imposed by heretofore device structures having longer channel lengths and larger device size. It is important to note and appreciate that a submicron self-aligned GaAs-gate FET can be made by the method disclosed herein utilizing only conventional photolithography which may not provide feature sizes less than about 1.5-2.0 μm. This new process is inherently simple and is capable of supporting a high level of circuit integration. This aspect is important because a simple process which supports a high level of integration contributes directly to yield, reliability and cost improvement.

Thus, there has been provided, in accordance with the invention, a novel process that fully satisfies the objects and advantages set forth.

While the invention has been described in conjunction with a specific preferred embodiment, it is evident that many alternatives, modifications and variations will be apparent to those skilled in the art in light of the foregoing description. It is therefore contemplated that the appended claims will embrace any such alternatives, modifications, variations as fall within the true scope and spirit of the invention.

What is claimed is:

1. Method for forming an insulated GaAs-gate FET having submicron channel length comprising:
    (a) providing a GaAs substrate having layers of AlGaAs and doped GaAs thereon;
    (b) forming a submicron dimensioned conductor contacting said doped GaAs layer;
    (c) forming, by anisotropic etching, using said conductor as a mask, a GaAs gate of submicron width from said doped GaAs layer, said conductor serving as self-aligned contact to said gate;
    (d) establishing submicron-wide insulator sidewalls to the GaAs gate and its associated contact structure; and
    (e) ion implanting to form source and drain in said substrate, said source and drain being self-aligned to said gate and the AlGaAs beneath the gate serving as the gate insulator.

2. The method as recited in claim 1 wherein said step (b) comprises:
    (p) forming a strip of an organic material having substantially vertical walls on said doped GaAs layer;
    (q) forming a conformal submicron thickness layer of a conductive material;
    (r) anisotropically etching said conductive material to form a controlled submicron thickness layer of said conductive material on said walls of said strip;
    (s) applying a thick layer of an organic material to the resulting structure to obtain a planarized structure; and
    (t) uniformly etching back the upper portions of said thick layer, said strip of organic material and said conductive material on said walls.

3. The method as recited in claim 2 wherein said step (t) is accomplished until said conductor is provided with substantially vertical walls.

4. The method as recited in claim 1 wherein said step (d) comprises:
    depositing a submicron thickness insulator layer on the structure resulting at the completion of step (c); and
    anisotropically etching said submicron thickness insulator layer to leave controlled submicron thickness insulator layer on the walls of said gate and said contact.

5. The method as recited in claim 4 further comprising following said ion implantation step, annealing to remove any damage caused to the GaAs substrate by said ion implantation and to activate the implanted ions.

6. The method as recited in claim 2 wherein the thickness of said conformal layer of conductive material is in the range of about 0.3-0.4 μm.

7. The method as recited in claim 4 wherein the thickness of said submicron thickness insulator layer is in the range of about 0.1-0.3 μm.

8. The method as recited in claim 6 wherein said conductor material is a refractory metal.

9. The method as recited in claim 7 wherein said insulator is $SiO_x$.

10. A process for forming an insulated GaAs-gate field effect transistor (FET) having submicrometer channel length comprising:
    providing a GaAs substrate having a relatively thin layer of AlGaAs thereon and a relatively thick doped GaAs layer on said AlGaAs layer;
    forming a conductive strip having submicrometer width and thickness dimensions on said doped GaAs layer, the width of said strip corresponding to the channel length of said FET;
    etching said doped GaAs layer using said strip as a mask to form a GaAs gate having substantially vertical walls and width identically matching with the width of said strip, said strip serving as a self-aligned conductive contact to said gate;
    forming a controlled submicrometer thickness layer on the vertical walls of said gate and said contact; and
    forming source and drain regions in said substrate using the said gate and said layer on said walls of said gate and said contact as a mask in a self-aligned relationship with said gate.

11. The process as recited in claim 10 wherein said gate width is about 0.3-0.5 μm.

12. The process as recited in claim 11 wherein the thickness of said layer on the vertical walls of said gate and said contact is such as to minimize the source/drain resistance and gate-source overlap capacitance of the FET.

13. The process as recited in claim 12 wherein the thickness of said layer on the vertical walls of said gate and said contact is about 0.1–0.3 μm.

14. The process as recited in claim 10 wherein the step of forming a conductive strip comprises:
   forming a first removable layer having a substantially vertical surface on said doped GaAs layer;
   forming a controlled submicrometer thickness conductive layer on the vertical surface of said first removable layer;
   coating the resulting structure with a thick second removable layer thereby obtaining a planarized structure composed of said first and second removable layers and said conductive layer;
   uniformly etching back the planarized structure to remove the upper portions of said first and second removable layers and conductive layer, thereby transforming said conductive layer into said strip embedded in said first and second removable layers remaining at the completion of the present etch-back step;
   removing said remaining first and second removable layers.

15. The process as recited in claim 14 wherein said first removable material is either photoresist or polyimide.

16. The process as recited in claim 14 wherein said second removable material is either photoresist or polyimide.

17. The process as recited in claim 14 wherein said conductive material is a refractory metal or a refractory metal alloy.

18. The process as recited in claim 10 wherein said submicrometer thickness layer is composed of an insulator material.

19. The process as recited in claim 18 wherein said step of forming said layer on the vertical walls of said gate and said contact comprises:
   depositing a conformal layer of said insulative material; and
   anisotropically etching said conformal layer to remove said conformal layer from everywhere except from said vertical walls of said gate and said contact.

20. Process for fabricating semiconductor integrated circuit having at least a field effect transistor device having a narrow gate comprising:
   providing a semi-insulating GaAs substrate having a gate insulating layer of AlGaAs thereon and a thicker highly doped GaAs layer on said AlGaAs layer;
   forming a layer of an organic material having substantially vertical surfaces and a substantially horizontal surface on said doped GaAs layer;
   forming a conformal submicron thickness conductive layer on said organic layer and said doped GaAs layer not masked by said organic layer;
   anisotropically etching said conformal conductive layer to remove said conductive layer from horizontal surfaces and leave said conductive layer on said substantially vertical surfaces;
   removing the undesired portions of said conductive layer on said vertical surfaces;
   applying a thick removable layer on the resulting structure thereby obtaining a planarized structure composed of said thick removable layer, said layer of organic material and conductive layer on selected portions of said vertical surfaces;
   uniformly etching back said planarized structure to transform said conductive layer on selected portions of said vertical surfaces into a conductive strip of submicron thickness and width while simultaneously removing the upper surface portions of said removable layer and said layer of organic material;
   using said conductive strip as a mask, etching to transform said doped GaAs layer into a GaAs gate having a width identical to that of said strip, said strip serving as self-aligned contact to said gate, said gate and said contact having substantially vertical sidewalls;
   forming a controlled submicron thick insulative layer on the said sidewalls of said gate and contact; and
   forming source and drain regions in said substrate by ion implantation through said AlGaAs layer using said gate in combination with said sidewalls as a mask, said source and drain being self-aligned to said gate.

21. The process as recited in claim 20 wherein said organic layer forming step comprises:
   applying a layer of photoresist to said doped GaAs layer;
   depositing a $Si_xN_y$ layer on said photoresist;
   patterning, by photolithography and etching, said $Si_xN_y$ layer into a desired pattern; and
   using the patterned $Si_xN_y$ layer as a mask, etching said photoresist.

22. The process as recited in claim 21 wherein said removable layer is photoresist or polyimide.

23. The process as recited in claim 22 wherein said conductive layer is composed of a refractory metal or a refractory metal alloy.

24. The process as recited in claim 23 wherein said step of etching back of said planarized structure comprises:
   reactive ion etching in oxygen plasma utilizing said $Si_xN_y$ layer as an etch stop; and
   reactive ion etching in $CF_4$ plasma for a predetermined period of time to obtain said strip of submicron thickness.

25. The process as recited in claim 24 wherein said source and drain regions are formed by implantation of silicon (Si+) ions.

26. The process as recited in claim 25 further comprising after said ion implantation step annealing the resulting structure by subjecting to either a halogen lamp or an infrared lamp at a temperature of 700°–800° C. for a few seconds.

27. The process as recited in claim 25 further comprising establishing conductive contacts with said source and drain regions.

28. The process as recited in claim 27 wherein said conductive contact material is gold-germanium-nickel alloy.

29. The process as recited in claim 27 wherein said AlGaAs layer thickness is in the range of about 200–300 Å.

30. The process as in claim 28 wherein said contacts are formed by lift-off process.

* * * * *